United States Patent [19]
Camacho et al.

[11] Patent Number: 5,933,375
[45] Date of Patent: Aug. 3, 1999

[54] MAIN AMPLIFIER WITH FAST OUTPUT DISABLEMENT

[75] Inventors: Stephen Camacho, Durham; Robert M. Walker, Rougemont, both of N.C.

[73] Assignee: Mitsubishi Semiconductor America, Inc., Durham, N.C.

[21] Appl. No.: 08/932,384

[22] Filed: Sep. 17, 1997

[51] Int. Cl.⁶ ........................................... G11C 7/00
[52] U.S. Cl. ................... 365/190; 365/189.11; 365/204; 365/205
[58] Field of Search .................... 365/190, 207, 365/189.05, 189.11, 204, 205

[56] References Cited

U.S. PATENT DOCUMENTS

| | | | |
|---|---|---|---|
| 4,577,125 | 3/1986 | Allen | 307/455 |
| 4,847,522 | 7/1989 | Fuller et al. | 307/473 |
| 4,972,102 | 11/1990 | Reis et al. | 307/451 |
| 5,180,936 | 1/1993 | McDonald | 307/348 |
| 5,309,042 | 5/1994 | Joly | 307/446 |
| 5,338,987 | 8/1994 | Tomasetti et al. | 307/570 |
| 5,438,278 | 8/1995 | Wong et al. | 326/27 |
| 5,488,322 | 1/1996 | Kaplinsky | 327/74 |
| 5,539,336 | 7/1996 | Nguyen et al. | 326/83 |
| 5,541,528 | 7/1996 | Montoye et al. | 326/34 |
| 5,598,371 | 1/1997 | Lee et al. | 365/190 |
| 5,657,275 | 8/1997 | Yoshida | 365/190 |
| 5,699,305 | 12/1997 | Kawashima | 365/190 |

*Primary Examiner*—David Nelms
*Assistant Examiner*—David Lam
*Attorney, Agent, or Firm*—McDermott, Will & Emery

[57] ABSTRACT

An amplifier of a type having complementary output nodes in a data output mode of operation. When an external output enable signal is at a low level, the amplifier is enabled to output a data signal. When the output enable signal is set into a high level, the amplifier is brought into an output disable mode, in which both of its output nodes are set to a low level. The amplifier contains logic circuitry for supplying the output nodes with the data signal and output enable signal. In the output disable mode, a shunting circuit is arranged between the output nodes to provide two discharge paths for a charge stored at one of the output nodes when the signal at this output node transfers from a high level to a low level.

19 Claims, 4 Drawing Sheets

FIG. 1 (Background)

TRUTH TABLE

| IN | ZOE | OUT | OUTC |
|----|-----|-----|------|
| L  | L   | L   | H    |
| H  | L   | H   | L    |
| X  | H   | L   | L    |

L=Logic level low
H=Logic level high
X=Don't care

FIG. 4

MAIN AMPLIFIER WITH FAST OUTPUT DISABLEMENT

TECHNICAL FIELD

The present invention relates to integrated circuit technology, and, more particularly, to amplifiers for driving circuits whose outputs may be placed in a floating or high impedance state.

BACKGROUND ART

In many applications, it is desirable to disable the output of an amplifier. For example, in a memory device, wherein different amplifiers drive the same data output line in different time periods, the output of one amplifier must be disabled to allow another amplifier to drive the line. Another example is an amplifier in a memory device with a bidirectional data input/output line, wherein the output of the amplifier may be disabled after each data reading operation to allow a data writing operation to be performed.

As illustrated in FIG. 1 of the drawings, a memory chip 10 may have a bidirectional data input/output line 12 for reading data from a memory array 14 and writing data to the memory array 14. An address and control signal generator 16 receives external address and control signals from an address and control signal input 18 to provide control of data reading and writing operations. A master clock input 20 supplies a clock generator 22 with an external master clock to control timing of data reading and writing operations. Input data are supplied to the memory array 14 from the data input/output line 12 via data input buffers/latches 24.

When a cell of the memory array is addressed for data reading, the data stored in the addressed cell is amplified through the memory cell sense amplifier. The output of the memory cell sense amplifier may be connected to a preamplifier 26 that supplies a main amplifier 28 with a preamplified data signal. The main amplifier 28 may have an input IN for receiving the data signal, and complementary outputs OUT and OUTC. An output driver composed of power MOS transistors 30 and 32 coupled in series between power sources VSSQ and VDDQ may be connected to the outputs OUT and OUTC for driving the data input/output line 12.

A data reading operation may be initiated for example by a raising edge of the external master clock. In response to the raising edge, the clock generator 22 controls the address and control signal generator 16 to produce an output enable signal ZOE supplied to a ZOE input of the main amplifier 28 to initiate data output from the memory input/output line 12.

The next edge of the external master clock may initiate a no operation cycle, in which the address and control signal generator 16 switches the logic level of the ZOE signal. Alternatively, a data writing operation may be decoded to switch the ZOE signal. When the ZOE signal is switched, the outputs OUT and OUTC of the main amplifier 28 are disabled to place the output driver into a floating or high impedance state before writing data via the input/output line 16.

Propagation and switching delays between the ZOE input and the outputs of the main amplifier 28 result in a time delay between switching the logic level of the output enable signal ZOE and disabling the outputs of the main amplifier 28. This time delay is called the output disable time ($t_{HZ}$).

In high-frequency applications, for example, at a 200 MHz rate, a clock cycle is reduced to 5 ns. At such rates, it is critical to reduce the output disable time of the main amplifier.

Therefore, it would be desirable to provide an amplifier having the output disable time reduced compared to conventional amplifiers.

DISCLOSURE OF THE INVENTION

Accordingly, an advantage of the invention is in providing an amplifier having the output disable time reduced compared to conventional amplifiers.

The above and other advantages of the invention are achieved, at least in part, by providing an amplifier having complementary first and second output nodes in a signal output mode of operation. Signal output circuitry is provided for producing a first level potential at the first output node and a second level potential at the second output node during a first signal output operation, and for producing the second level potential at the first output node and the first level potential at the second output node during a second signal output operation. A control signal is supplied to the amplifier to prevent signal output from the first and second output nodes in an output disable mode of operation. In response to the control signal, a shunting circuit coupled between the first and second output nodes provides at least two conductive paths between the first output node and a source of the second level potential after the first signal output operation, to accelerate transition of the first output node from the first level potential to the second level potential.

Also, the shunting circuit may be arranged to provide at least two conductive paths between the second output node and the source of the second level potential after the second signal output operation, to accelerate transition of the second output node from the first level potential to the second level potential. The first level potential may be higher than the second level potential.

In accordance with a preferred embodiment of the invention, the shunting circuit may comprise a shunting MOS transistor connected between the first and second output node and having a gate supplied with the control signal.

Also, the shunting circuit may incorporate a first MOS transistor coupled between said first output node and a source of a low level potential, and second and third MOS transistors coupled in series between the second output node and the source of a low level potential.

After the first signal output operation, the shunting circuit may be arranged to provide a first conductive path via the shunting MOS transistor and the second and third MOS transistors, and a second conductive path via the first MOS transistor.

After the second signal output operation, the shunting circuit may be arranged to provide a third conductive path via the shunting MOS transistor and the first MOS transistor, and a fourth conductive path via the second and third MOS transistors.

In accordance with one aspect of the invention, the amplifier may further include a level shifter for translating a range of the input signal into a range of the output signal. The logic shifter may be arranged to incorporate the first MOS transistor during the first and second signal output operations.

In accordance with another aspect of the invention, the amplifier may further include a logic gate circuit for driving the second output node. The logic gate circuit may be arranged to incorporate the second and third MOS transistors during the first and second signal output operations.

In accordance with a further aspect of the invention, a memory device may be provided with a memory array having storage cells for storing data, and at least one amplifier responsive to data signal read from the memory array and having complementary first and second output nodes in a data output mode of operation.

The amplifier may comprise circuitry for supplying the data signal to the first and second output node to produce a data output signal of the memory device in the data output mode. A control signal may be provided to prevent the first and second output nodes from producing the data output signal in an output disable mode of operation.

A shunting circuit may be coupled between the first and second output nodes for providing at least two discharge paths for a first charge stored at the first output node after a first data output operation, to accelerate transition of the first output node to a logic level of the second output node.

Also, the shunting circuit may be arranged to provide at least two discharge paths for a second charge stored at the second output node after a second data output operation, to accelerate transition of the second output node to a logic level of the first output node.

In accordance with a method of the present invention the following operations are carried out for disabling outputs of an amplifier having complementary first and second output nodes in a signal output mode of operation:
  performing a first signal output operation to produce a high level potential at the first output node and a low level potential at the second output node,
  supplying a control signal for disabling signal output from the amplifier after the first signal output operation, and
  arranging at least two conductive paths between the first output nodes and a source of the low level potential to accelerate transition of the first output node to the low level potential.

The method of the present invention may further comprises the steps of:
  performing a second signal output operation to produce a high level potential at the second output node and a low level potential at the first output node,
  supplying a control signal for disabling signal output from the amplifier after the second signal output operation, and
  arranging at least two conductive paths coupled between the second output node and the source of the low level potential to accelerate transition of the second output node to the low level potential.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

FIG. 4 is a truth table that lists truth values at inputs and outputs of the main amplifier.

BEST MODE FOR CARRYING OUT THE INVENTION

Figure 1:
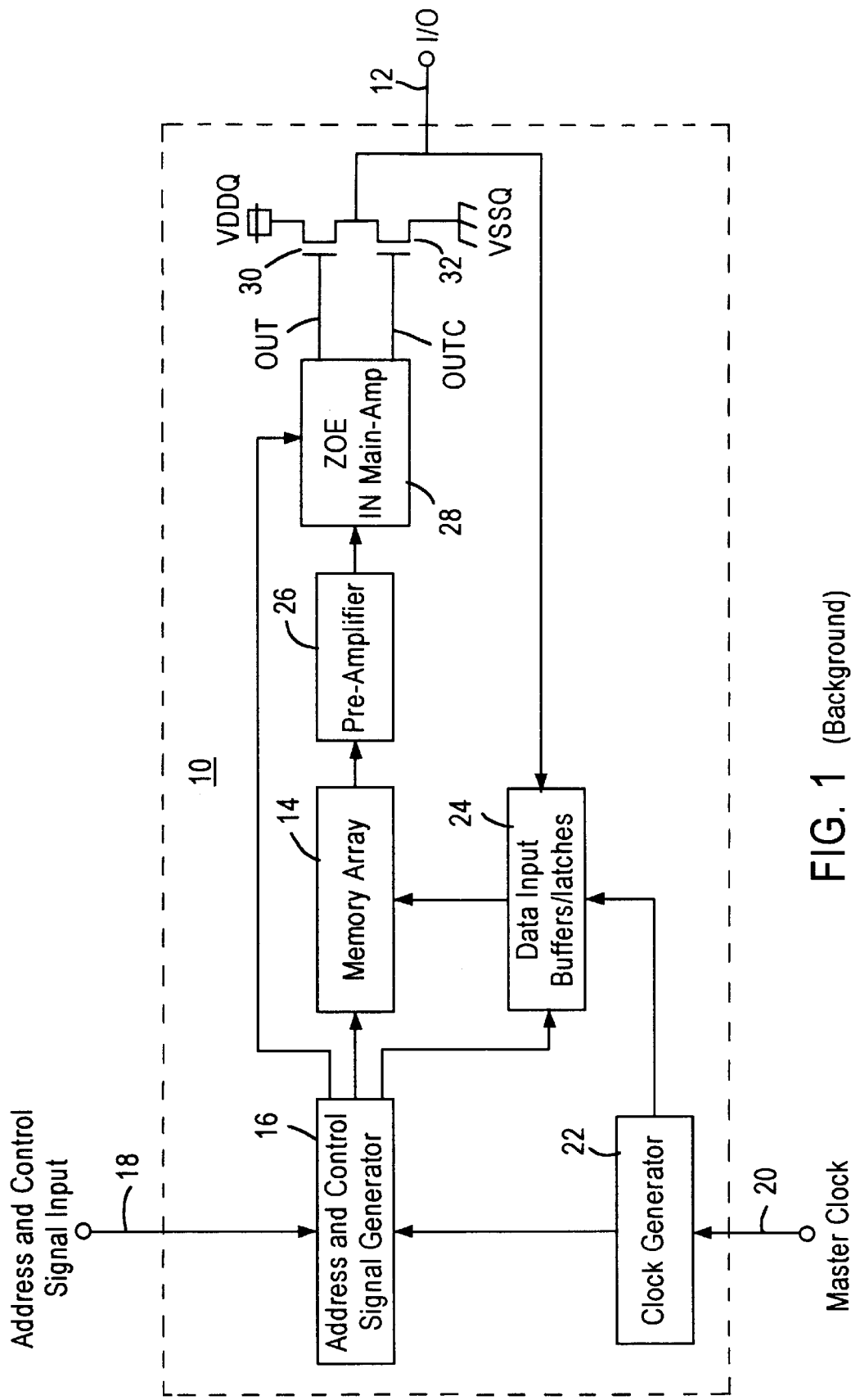
FIG. 1 is a simplified block diagram of a conventional memory chip.

The present invention will be described with the example of a main amplifier in a memory device illustrated in FIG. 1. However, it will become apparent that the present invention is also applicable to other amplifiers having an output disable mode of operation.

Figure 2:
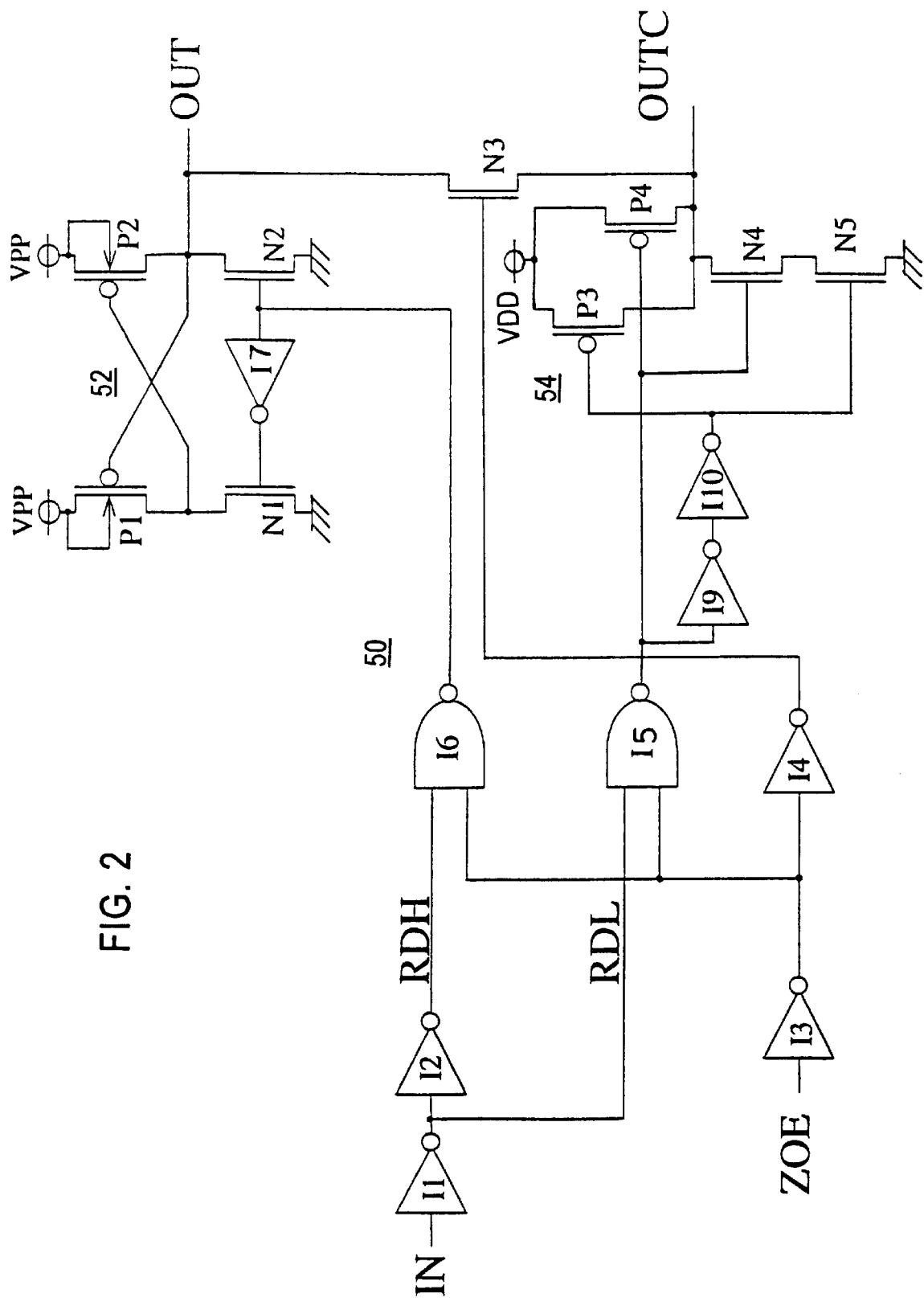
FIG. 2 is a diagram of a main amplifier of the present invention.
Figure 3:
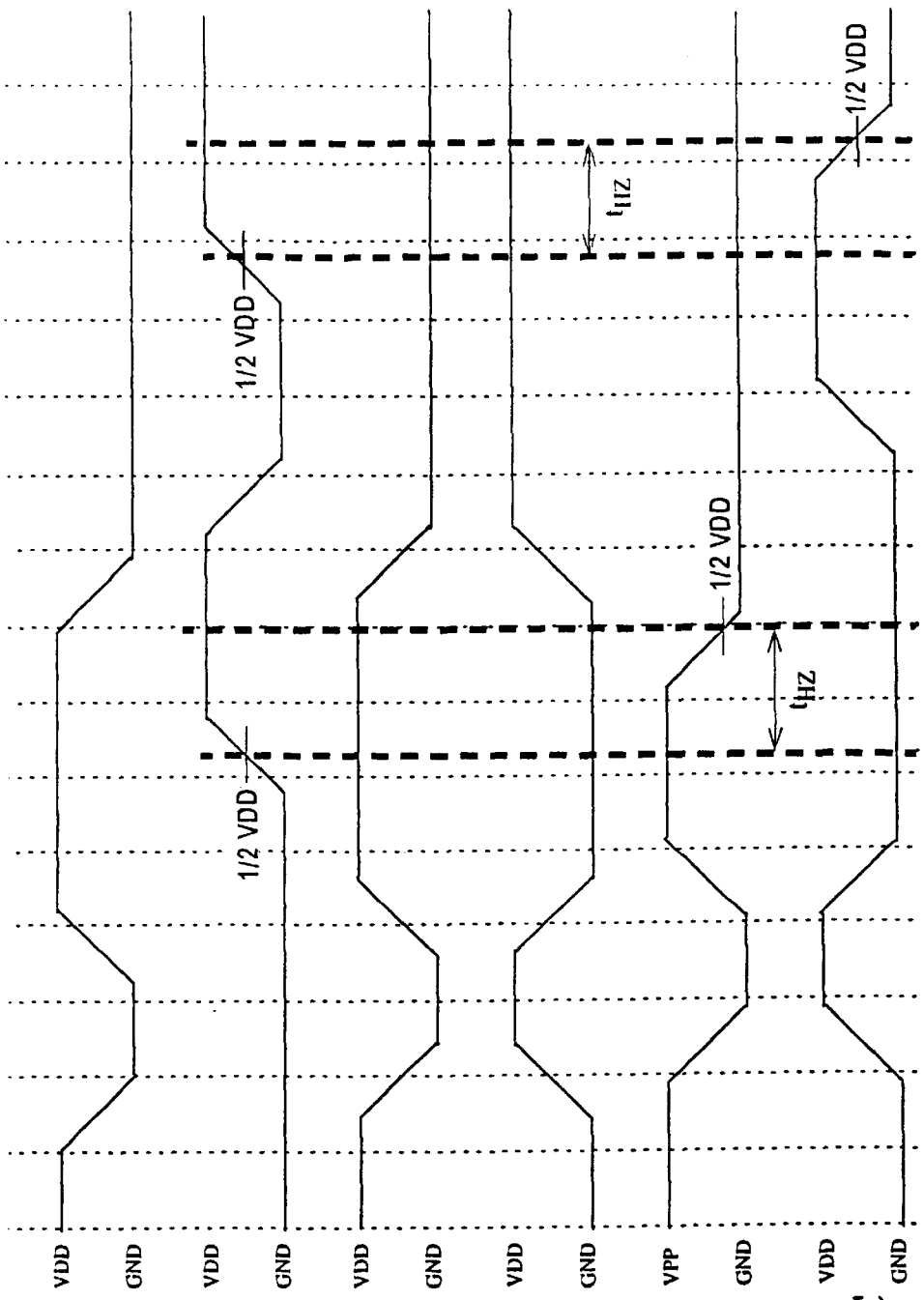
FIGS. 3A–3F are timing diagrams that illustrate various signals in the main amplifier.

Reference is now made to FIG. 2 showing a circuit diagram of a main amplifier 5o of the present invention, and to FIGS. 3A–3F illustrating signals in various nodes of the main amplifier 50. The main amplifier 50 comprises an input inverter I1 that receives input data IN (FIG. 3A) supplied, for example, from a preamplifier and produces a data read signal RDL (FIG. 3D). An inverter I2 is connected to the output of the inverter I1 to produce a data read signal RDH (FIG. 3C) inverted with respect to the RDL signal.

Inverters I3 and I4 are arranged for receiving an output enable signal ZOE (FIG. 3B) supplied, for example, from a control signal generator. A NAND gate I5 has its first input connected to the output of the inverter I1 for receiving the RDL signal, and its second input coupled to the output of the inverter I3 for receiving the inverted ZOE signal. A NAND gate I6 receives the RDH signal from the output of the inverter I2, and the inverted ZOE signal from the output of the inverter I3.

The output signal of the NAND I6 is supplied to a level shifter 52 arranged for translating a small voltage range produced at the input of the main amplifier 50 into a larger voltage range required at its output OUT. The level shifter 52 may comprise p-channel MOS transistors P1 and P2, and n-channel MOS transistors N1 and N2 arranged in a cross-coupled latch configuration between a boosted voltage supply terminal VPP and a ground terminal. The output of the NAND gate I6 is connected to the gate of the transistor N2 and, via an inverter I7, is coupled to the gate of the transistor N1. The gate of the transistor P2 is coupled to the common node of the transistors P1 and N1, whereas the gate of the transistor P1, and the common node of the transistors P2 and N2, are connected to the output OUT of the amplifier 50.

The output signal of the NAND gate I5 is fed to a NAND gate 54 which may be implemented by a pair of p-channel MOS transistors P3 and P4, and a pair of n-channel MOS transistors N4 and N5. The transistors P3 and P4 are connected in parallel between a voltage supply terminal VDD and the output OUTC of the main amplifier 50. The transistors N4 and N5 are connected in series between the output OUTC and a ground terminal.

Gates of the transistors P4 and N4 may define a first input of the NAND gate 54 supplied with the output signal of the NAND gate I5. Gates of the transistors P3 and N5 may define a second input of the NAND gate 54 coupled to the output of the NAND gate I5 via a chain of inverters I9 and I10.

The output of the inverter I4 is coupled to the gate of an N-channel MOS transistor N3 connected between the outputs OUT and OUTC of the main amplifier 50.

Voltage VDD supplied to all p-channel substrates of the amplifier 50, except the level shifter 52, may be equal to 3.3 V, whereas boosted voltage VPP supplied to p-channel transistors of the level shifter 52 may be set at 4.0–6.0 V. All n-channel substrates of the amplifier 50 may be provided with voltage VBB equal to −2 V.

Referring to timing diagrams in FIGS. 3A–3F, the operation of the main amplifier 50 is as follows. To enable the main amplifier 50 to output data read from the memory array, the output enable signal ZOE (FIG. 3B) may be set at a low logic level. For example, the high logic level of the signals IN, ZOE, RDH, RDL and OUTC (FIGS. 3A–3D, and 3F) may correspond to the VDD value, and the low logic level of these signals may correspond to the ground potential level. The high logic level of the signal OUT (FIG. 3E) may correspond to the VPP value, and the low logic level of this signal may correspond to the ground potential level.

In a data output mode defined by the low level of the ZOE signal, when the input data signal IN (FIG. 3A) goes low (for example, bit 0 is read from the memory array), the RDH signal (FIG. 3B) produced at the output of the inverter I2 goes low, and the RDL signal (FIG. 3D) at the output of the inverter I1 goes high. As a result, the OUT signal (FIG. 3E) produced at the OUT terminal of the main amplifier 50 goes low, and the OUTC signal (FIG. 3F) produced at the OUTC terminal of the main amplifier OUTC goes high.

When the IN signal (FIG. 3A) goes high indicating that bit 1 is read, the RDH signal (FIG. 3C) goes high, and the RDL signal (FIG. 3D) goes low. This results in switching the OUT signal (FIG. 3E) into a high level, and the OUTC signal (FIG. 3F) into a low level.

Accordingly, as illustrated in the truth table in FIG. 4, in a data output mode (ZOE is at a low level), when the IN signal is at a low level, the OUT signal is at a low level, the OUTC signal is at a high level. When the IN signal is at a high level, the OUT signal is at a high level, and the OUTC signal is at a low level.

After each data reading operation, the output enable signal ZOE is brought to a high level to place the main amplifier in an output disable mode, in which the outputs OUT and OUTC of the main amplifier 50 are disabled. For example, the output disable mode may be carried out in a no operation (NOP) cycle of the master clock in response to the raising edge of the master clock following a data reading operation. Alternatively, the output disable mode may be performed asynchronously, and the ZOE signal may be switched independently from the master clock.

As shown in the truth table in FIG. 4, in the output disable mode defined by a high level of the ZOE signal, both the OUT and OUTC signals are at a low level, and the data signal IN is in a don't care state (X) indicating that it does not matter whether the data supplied from the memory array is at a high or low level. Thus, the IN signal (FIG. 3A) may be either at a high or low level.

As discussed above, the main amplifier 50 may be brought into the output disable mode after reading either bit 1 or bit 0 from the memory array. Immediately after a bit 1 reading operation (the IN signal is at a high level), the OUT signal (FIG. 3E) is at a high level and the OUTC signal is at a low level. The high level of the is ZOE signal (FIG. 3B) causes a high level at gates of the transistors N2 and N3, and maintains a high level at gates of the transistors N4 and N5. Thus, the transistors N2 and N3 turn on, and the transistors N4 and N5 remain on. As a result, two conductive discharge paths are provided for a charge stored at the OUT node. One discharge path goes from the OUT node, via the transistor N2, to the ground. The other discharge path connects the OUT node to the ground, via the transistors N3, N4 and N5. Thus, the OUT signal (FIG. 3E) is driven to a low level, while the OUTC signal (FIG. 3F) remains at the low level.

Immediately after a bit 0 reading operation (the IN signal is at a low level), the OUT signal (FIG. 3E) is at a low level, and the OUTC signal (FIG. 3F) is at a high level. When the ZOE signal goes high, the transistors N2 and N3 turn on, and the transistors N4 and N5 remain on. As a result, two conductive discharge paths are created for a charge stored at the OUTC node. One discharge path connects the node OUTC to the ground via the transistors N2 and N3. The other discharge path goes from the node OUTC, via the transistors N4 and N5, to the ground. Thus, the OUTC signal (FIG. 3F) is driven to a low level, whereas the OUT signal remains at the low level.

When both of the nodes OUT and OUTC are at a low level, the data output from the main amplifier 50 is disabled. An output driver, which may be connected to the OUT and OUTC node for driving the output of the memory device, is set to a floating or high-impedance state.

Propagation and switching delays between the ZOE input and the outputs of the main amplifier 28 result in a time delay between switching the logic level of the output enable signal ZOE and disabling the outputs of the main amplifier 28. This time delay corresponds to the output disable time ($t_{HZ}$) of the amplifier 50.

As shown in FIGS. 3B, 3E, and 3F, the output disable time $t_{HZ}$ is defined as a time period between the instant, at which the ZOE signal reaches the ½ VDD level, and the instant, at which the OUT or OUTC signal drops to the ½ VDD level.

As discussed above, during the output disable time period when either the output signal OUT or the output signal OUTC transfers from a high level to a low level, and the ZOE signal is brought to a high level, the amplifier of the present invention has two output discharge paths compared to a single output discharge path in a conventional amplifier. An additional discharge path substantially reduces the time required for the transition of the OUT or OUTC signal from a high level to a low level. Accordingly, the output disable time of the amplifier 50 is substantially reduced compared to conventional amplifiers.

There accordingly has been described an amplifier of a type having complementary output nodes in a data output mode of operation. When an external output enable signal is at a low level, the amplifier is enabled to output a data signal. When the output enable signal is set into a high level, the amplifier is brought into an output disable mode, in which both of its output nodes are set to a low level. The amplifier contains logic circuitry for supplying the output nodes with the data signal and output enable signal. A shunting circuit is arranged between the output nodes to provide two discharge paths for a charge stored at one of the output nodes when the signal at this output node transfers from a high level to a low level.

As a result, the output disable time of the amplifier is substantially reduced compared to conventional amplifiers.

In this disclosure, there are shown and described only the preferred embodiments of the invention, but it is to be understood that the invention is capable of changes and modifications within the scope of the inventive concept as expressed herein.

What is claimed is:

1. An amplifier having complementary first and second output nodes in a signal output mode of operation, comprising:

signal output circuitry for supplying an input signal to said first and second output node to produce a first level potential at said first output node and a second level potential at said second output node during a first signal output operation, circuitry for providing a control signal to prevent signal output from said first and second output nodes in an output disable mode of operation, and a shunting circuit coupled between said first and second output nodes and responsive to said control signal for providing at least two conductive paths between said first output node and a source of said second level potential after said first signal output operation, to accelerate transition of said first output node to said second level potential.

2. The amplifier of claim 1, wherein said signal output circuitry is arranged to produce the second level potential at said first output node and the first level potential at said second output node during a second signal output operation.

3. The amplifier of claim 2, wherein said shunting circuit is arranged to provide at least two conductive paths between said second output node and the source of said second level potential after said second signal output operation, to accelerate transition of said second output node to said second level potential.

4. The amplifier of claim 3, wherein said first level potential is higher than said second level potential.

5. The amplifier of claim 1, wherein said shunting circuit comprises a shunting MOS transistor connected between said first and second output node and having a gate supplied with said control signal.

6. The amplifier of claim 5, wherein said shunting circuit further comprises a first MOS transistor coupled between said first output node and a source of a low level potential.

7. The amplifier of claim 6, wherein said shunting circuit further comprises second and third MOS transistors coupled in series between said second output node and said source of a low level potential.

8. The amplifier of claim 7, wherein after initiation of said first signal output operation, said shunting circuit is arranged to provide a first conductive path via said shunting MOS transistor and said second and third MOS transistors, and a second conductive path via said first MOS transistor.

9. The amplifier of claim 8, wherein after initiation of said second signal output operation, said shunting circuit is arranged to provide a third conductive path via said shunting MOS transistor and said first MOS transistor, and a fourth conductive path via said second and third MOS transistors.

10. The amplifier of claim 9, wherein said amplifier further includes a level shifter for translating a range of said input signal into a range of said output signal.

11. The amplifier of claim 10, wherein said level shifter is arranged to incorporate said first MOS transistor during said first and second signal output operations.

12. The amplifier of claim 9, wherein said amplifier further includes a logic gate circuit for driving said second output node.

13. The amplifier of claim 12, wherein said logic gate circuit is arranged to incorporate said second and third MOS transistors during said first and second signal output operations.

14. A memory device comprising:
a memory array having storage cells for storing data, and
at least one amplifier responsive to data signal read from said memory array and having complementary first and second output nodes in a data output mode of operation, said amplifier comprising:
circuitry for supplying said data signal to said first and second output node to produce a data output signal of said memory device in said data output mode,
circuitry for providing a control signal to prevent said first and second output nodes from producing said data output signal in an output disable mode of operation, and
a shunting circuit coupled between said first and second output nodes and responsive to said control signal for providing at least two discharge paths for a first charge stored at said first output node after a first data output operation, to accelerate transition of said first output node to a logic level of said second output node.

15. The memory device of claim 14, wherein said shunting circuit is arranged to provide at least two discharge paths for a second charge stored at said second output node after a second data output operation, to accelerate transition of said second output node to a logic level of said first output node.

16. The memory device of claim 15, wherein after said first data output operation, said first output node is set to a logic level higher than a logic level of said second output node.

17. The memory device of claim 16, wherein after said second data output operation, said second output node is set to a logic level higher than a logic level of said first output node.

18. A method of disabling outputs of an amplifier having complementary first and second output nodes in a signal output mode of operation, including the steps of:
performing a first signal output operation to produce a high level potential at said first output node and a low level potential at said second output node,
supplying a control signal for disabling signal output from said amplifier after said first signal output operation, and
arranging at least two conductive paths between said first output node and a source of said low level potential to accelerate transition of said first output node to said low level potential.

19. The method of claim 18, further comprising the steps of:
performing a second signal output operation to produce a high level potential at said second output node and a low level potential at said first output node,
supplying a control signal for disabling signal output from said amplifier after said second signal output operation, and
arranging at least two conductive paths coupled between said second output node and the source of said low level potential to accelerate transition of said second output node to said low level potential.

* * * * *